United States Patent [19]

Nicollini

[11] Patent Number: 5,130,666
[45] Date of Patent: Jul. 14, 1992

[54] BALANCED MICROPHONE PREAMPLIFIER IN CMOS TECHNOLOGY

[75] Inventor: Germano Nicollini, Piacenza, Italy

[73] Assignee: SGS-Thomson Microelectronics S.r.l., Milan, Italy

[21] Appl. No.: 662,243

[22] Filed: Feb. 27, 1991

[30] Foreign Application Priority Data

Mar. 1, 1990 [IT] Italy ............................. 19533 A/90

[51] Int. Cl.$^5$ ............................................ H03F 3/45
[52] U.S. Cl. .................................... 330/253; 381/121
[58] Field of Search ............ 330/253, 257, 260, 277, 330/301; 381/120, 121

[56] References Cited

U.S. PATENT DOCUMENTS

| | | | |
|---|---|---|---|
| 3,944,944 | 3/1976 | Ellenbecker | 381/120 X |
| 4,742,308 | 5/1988 | Banu | 330/258 |
| 4,797,631 | 1/1989 | Hsu et al. | 330/253 |

OTHER PUBLICATIONS

Krabbe, "A High Performance Monolithic Instrumentation Amplifier", *1971 IEEE International Solid-State Circuits Conference*, pp. 186, 187, and 205.

Wurcer et al, "A Programmable Instrumentation Amplifier for 12-Bit Resolution Systems", *IEEE Journal of Solid-State Circuits*, vol. SC-17, No. 6, pp. 1102–1111 (Dec. 1982).

Gray, "Basic MOS Operational Amplifier Design: An Overview", Department of Electrical Engineering and Computer Sciences of the University of Calif., Berkeley, California, pp. 28–49 (1980).

*Primary Examiner*—Steven Mottola

[57] ABSTRACT

The preamplifier includes a first amplifier stage (M1A, M2A) and a second amplifier stage (M1, M2), both of which are of the differential type, have the same dimensions, have their output nodes connected in parallel to one another, and drive a load formed by a current mirror (M3, M4). A third differential amplifier stage with single-ended output (M6, M7, M8, M9, M10, M11) driven by the current mirror supplies the final output voltage of the preamplifier. The input nodes of the first stage act as input for the differential signal to be amplified, and the input nodes of the second stage are driven respectively by a preset reference voltage ($V_{CM}$) and by a voltage ($V_x$) which is proportional to the final output voltage of the preamplifier. A negative voltage-current feedback is thus obtained, due to the fact that a difference in current is generated between the respective output nodes of the first and second stages; the difference is proportional to the difference between the differential signal to be amplified and the difference between the reference voltage and the voltage which is proportional to the final output voltage ($V_x$-$V_{CM}$).

20 Claims, 1 Drawing Sheet

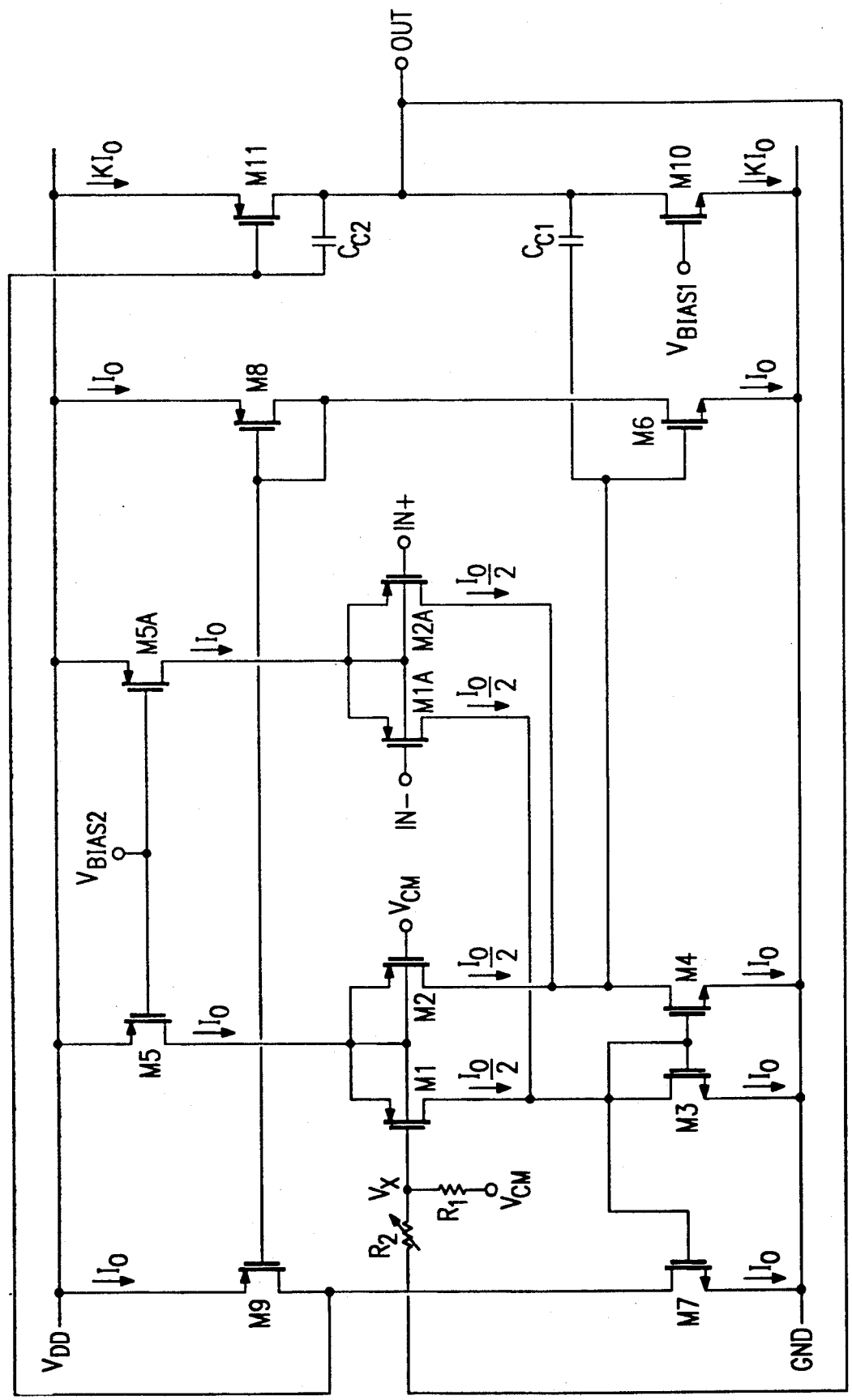

BALANCED MICROPHONE PREAMPLIFIER IN CMOS TECHNOLOGY

The present invention relates to a balanced microphone preamplifier in CMOS technology, particularly telephones.

As is known, modern handset telephones have microphones (such as an electret, dynamic, piezoelectric microphone) which allow a more faithful reproduction than the conventional carbon microphone used previously. However, known microphones have the disadvantage that the generated electrical signal is much smaller than that supplied by the carbon microphone. Therefore it has become necessary to include a so-called preamplifier in the telephone set in order to raise the level of the signal.

The usually requested characteristics of a preamplifier of this type are low noise, low distortion and a balanced input. Whereas low noise and low distortion are general requirements of any amplifier circuit, as the person skilled in the art knows, balanced input is instead a typical requirement of said microphone preamplifiers, and is due to the need to prevent as much as possible the signal generated by the microphone from being affected by noise associated with the line which connects it to the preamplifier, i.e. while it is still at a low level. The length of the two wires which form this connection is in fact approximately 1 meter, and said wires can thus pick up spurious signals such as the 50-Hz power distribution signal. Said signals, however, are in common mode, and can therefore be neutralized effectively if the amplifier has a balanced input, which is known to reject common-mode noise, completely.

Other desirable characteristics in microphone preamplifiers are a wide output swing, so as to set no limitations to the value of amplification of the signal, and also the possibility of varying the gain in order to adapt the preamplifier to the various types of microphone.

Several instrumentation amplifiers are known to have the above listed desirable characteristics, and which could therefore be applied to telephony. However, they are almost exclusively of the bipolar transistor type (BJT), for example as described in "A High Performance Monolithic Instrumentation Amplifier" by H. Krabbe, IEEE International Solid-State Circuits Conference, 1971, pages 186, 187, and 205, or in "A Programmable Instrumentation Amplifier for 12-Bit Resolution Systems" by Scott A. Wurcer and Lewis W. Counts, IEEE Journal of Solid-State Circuits, vol. SC-17 no. 6, December 1982 pages 1102-1111. These amplifiers are extremely complicated, with a very large number of transistors, and are thus not suitable for being integrated in CMOS technology.

The aim of the invention is therefore to provide a microphone preamplifier which has the above characteristics and can be easily manufactured in CMOS technology.

The invention achieves this aim and other objects and advantages as will become apparent from the continuation of the description with a balanced microphone preamplifier in CMOS technology, for differential input signals, characterized in that it comprises a first amplifier stage and a second amplifier stage, both of said stages being differential, and having the same dimensions, each of said stages having its own biasing current source, said stages having output nodes connected in parallel to one another and driving a load formed by a first current mirror, said first stage having input nodes acting as balanced input for the differential signal to be amplified, said second stage having input nodes driven respectively by a preset reference voltage and by a voltage which is a function of the final output voltage of the preamplifier, so that a difference in current is generated between the respective output nodes of the first and second stages, said difference in current being proportional to the difference between the differential signal to be amplified and the difference between said reference voltage and said voltage which is a function of the final output voltage.

The invention is now described in greater detail with reference to a preferred embodiment which is illustrated in the accompanying drawing, which is given by way of non-limitative example and wherein:

The only Figure is a circuit diagram of a microphone preamplifier according to the invention.

With reference to the figure, the preamplifier, according to the preferred embodiment of the invention, comprises a first differential amplifier stage which is formed by two transistors M1A and M2A, the gates whereof constitute the two differential inputs IN− and IN+, and the sources whereof are connected in common to a transistor M5A which acts as current source and for this purpose is polarized by an adapted voltage $V_{BIAS2}$ applied to its gate. The purpose of this differential stage is to produce a difference in current between the respective drains which is proportional exclusively to the difference of the voltage signals applied to the input nodes IN− and IN+ and at the same time to reject any common-mode signal present on said inputs.

The preamplifier further comprises a second differential amplifier stage which is formed by two transistors M1, M2 which are connected, as in the first stage and with the same dimensions, with their own current source M5 on their sources; said second stage is biased by the same voltage $V_{BIAS2}$ which biases the first stage, and its purpose is to provide a negative voltage-current feedback, generating a difference in current between the respective drains which is proportional to the difference between a voltage reference $V_x$, applied to one of its inputs, and a reference voltage $V_{CM}$, generally chosen halfway between the power supplies, applied to the other input. Said signal $V_x$ is obtained by means of a resistive divider $R_1$, $R_2$ between the output OUT and the signal $V_{CM}$.

As it is apparent to the person skilled in the art, the two resistors $R_1$ and $R_2$ thus set the value A of the gain of the circuit, which is:

$$A = 1 + R_2/R_1$$

Thus, by varying $R_2$ it is possible to vary the amplification to adapt the preamplifier to the various types of microphone, as will become apparent hereinafter.

The load which is connected in common to the drains of the first and second stages is constituted by a current mirror which is formed in a known manner by transistors M3, M4 the sources of which are connected to the ground and the drains whereof are connected to the respective drains of the two amplifier stages. The effect of the current mirror is to provide the difference of the currents associated with the drains of the two amplifier stages, to thus convert the signal from differential to single-ended, and finally to convert the signal from a current signal to a voltage signal, with a high gain, on the drain node of M4.

A further amplifier stage, controlled by the current mirror M3, M4, is formed by two transistors M6, M7 which drive another current mirror M8, M9. This stage introduces a further gain in the circuit and drives the gate of an output transistor M11 which is connected to the common voltage source $V_{DD}$ and the dimensions whereof are k times those of M9, where k is the current ratio required between M11 and M9. A fixed current source, formed by a transistor M10 which is driven by a reference voltage $V_{BIAS1}$, provides the polarization current to the output circuit.

In the circuit of FIG. 1, the total noise, as for any CMOS circuit, can be of two types, i.e. the thermal noise $V_{eqth}$ and the flicker noise $V_{eqfl}$. As shown for example by P. R. Gray, "Basic MOS Operational Amplifier Design: An Overview", Department of Electrical Engineering and Computer Sciences of the University of California, Berkeley, Calif., 1980, pages 28-49 the thermal noise is given by:

$$V_{eqth}^2 = 4kT \left( \frac{2}{3} \frac{1}{\sqrt{\frac{\mu C_o}{2} \frac{W}{L} I}} \right) \Delta f$$

whereas the flicker noise is given by:

$$V_{eqfl}^2 = \frac{K_f}{C_{ox} WL(f)^{\Delta f}} \Delta f$$

where the symbols have the same meanings as in P. R. Gray, op. cit.

Since flicker noise is dominant in MOS circuits at audio frequencies, and since $k_F$ is much smaller for P-channel circuits than for N-channel ones, the above relations show that noise is minimal with a P-channel input circuit with considerable W and L (width and length) dimensions.

Again P. R. Gray, op. cit., shows that the noise of the other MOS devices is fed back to the input divided by the gain between the input and the MOS devices themselves. From this point of view, only the transistors M3 and M4 are critical, since their noise is fed back to the input divided by the square of the ratio of the transconductances between the transistors M1A, M2A and M3, M4. Since transconductance is proportional to $\sqrt{W/L}$, it is necessary that $L_{3,4} \gg L_{1A,2A}$, while W may be comparable.

As regards distortion, the linearity interval of the pair M1A, M2A must be much greater than the maximum (differential) signal voltage produced by the microphone, which, as mentioned above, is low (typically 80 mV). This condition can be met both by appropriately choosing the dimension of the transistors and by increasing the biasing current $I_n$.

To keep the distortion low, as known to the person skilled in the art, the output stage M11 must furthermore operate in class A, i.e. it must have a fixed current source, which is constituted by M10 in the illustrated example. The two compensation capacitors $C_1$ and $C_2$ are calculated according to the method known as "nested Miller compensation" and ensure the stability of the entire circuit.

The circuit according to the invention has the advantage of being of great simplicity, which leads to a reduced area occupation and power consumption with respect to bipolar solutions. At the same time, the circuit has the following advantages:
balanced input;
wide output swing (rail-to-rail output swing);
low distortion (lower than 0.01% for $V_{in} < 100$ mV);
relatively low noise.

On the other hand, the circuit according to the invention, as mentioned above, is limited in the amplitude of the input voltage. However, this is not a disadvantage in the microphonic application which is the subject of the invention.

A preferred embodiment of the invention has been described, but it is understood that the prison skilled in the art can devise obvious modifications and variations which are comprised within the scope of the inventive concept.

Where technical features mentioned in any claim are followed by reference signs, those reference signs have been included for the sole purpose of increasing the intelligibility of the claims and accordingly, such reference signs do not have any limiting effect on the scope of each element identified by way of example by such reference signs.

I claim:

1. A balanced microphone preamplifier in CMOS technology, for differential input signals, characterized in that it comprises a first amplifier stage and a second amplifier stage, both of said stages being differential and having the same dimensions, each of said stages having its own biasing current source, said stages having output nodes connected in parallel to one another and driving a load formed by a first current mirror, said first stage having input nodes acting as balanced input for the differential signal to be amplified, said second stage having two input nodes, one of said second stage input nodes being driven by a preset reference voltage and the other one of said second stage input nodes being driven by a voltage which is a function of the final output voltage of the preamplifier, so that a difference in current is generated between the respective output nodes of the first and second stages, said difference in current being proportional to the difference between the differential signal to be amplified and the difference between said reference voltage and said voltage which is a function of the final output voltage.

2. A microphone preamplifier according to claim 1, characterized in that said voltage which is a function of the final output voltage of the preamplifier is obtained from an intermediate node of a resistive divider which is connected between the final output voltage of the preamplifier and said reference voltage.

3. A microphone preamplifier according to claim 2, characterized in that it further comprises a single-ended output amplifier stage which is driven by said first current mirror.

4. A microphone preamplifier according to claim 3, characterized in that said single-ended output amplifier stage comprises a first transistor, a second transistor, a second current mirror, an output transistor, and a fixed current source for said output transistor; wherein said first and second transistors are driven by said first current mirror; wherein said second current mirror is driven by said first and second transistor; and wherein said output transistor is driven by an output of said second current mirror.

5. A microphone preamplifier according to claim 1, characterized in that it further comprises a single-ended output amplifier stage which is driven by said first current mirror.

6. A microphone preamplifier according to claim 5, characterized in that said single-ended output amplifier stage comprises two transistors, which are driven by said first current and which drive a second current mirror, and an output transistor with its own fixed current source, driven by an output of said second current mirror.

7. A balanced CMOS preamplifier comprising a first differential amplifier stage and a second differential amplifier stage, a first biasing current source for said first differential amplifier stage, a second biasing current source for said second differential amplifier stage, a first current mirror, each of said first and second differential amplifier stages having first and second output nodes with the output nodes of said first differential amplifier stage being connected in parallel with the output nodes of said second differential amplifier stage for driving said first current mirror such that the first output node of said first differential amplifier stage is connected to the first output node of said second differential amplifier stage while the second output node of said first differential amplifier stage is connected to the second output node of said second differential amplifier stage, said first differential amplifier stage having first and second input nodes for the input signals, said second differential amplifier stage having first and second input nodes, a voltage source connected to said first input node of said second differential amplifier stage for applying a reference voltage to said first input node of said second differential amplifier stage, a first circuit having an output node for producing the final output voltage of said preamplifier in response to an output of said first current mirror, a second circuit having an output node for producing a second voltage which is responsive to the difference between said reference voltage and said final output voltage and for applying said second voltage to said second input node of said second differential amplifier stage, so that there is a current difference between the current generated at the first output nodes and the current generated at the second output nodes with said current difference being responsive to the difference between said input signals and to the difference between said reference voltage and said second voltage.

8. A preamplifier according to claim 7, wherein said second circuit comprises a first resistor connected between said output node of said first circuit and said output node of said second circuit, and a second resistor connected between said voltage source and said output node of said second circuit.

9. A preamplifier according to claim 8, wherein the resistance of at least one of said first and second resistors can be varied in order to vary the gain of the preamplifier.

10. A preamplifier according to claim 9, wherein said first circuit comprises a single-ended output amplifier stage.

11. A preamplifier according to claim 10, wherein said single-ended output amplifier stage comprises a first transistor, a second transistor, a second current mirror, an output transistor, and a fixed current source for said output transistor; wherein said first and second transistors are connected so as to be driven by said first current mirror; wherein said second current mirror is connected so as to be driven by said first and second transistors; and wherein said output transistor is connected so as to be driven by an output of said second current mirror.

12. A preamplifier according to claim 11, further comprising a first compensation capacitor connected between the gate of said first transistor and the output node of said first circuit, and a second compensation capacitor connected between the gate of said output transistor and the output node of said first circuit.

13. A preamplifier according to claim 7, wherein said first differential amplifier stage comprises first and second transistors, each of said first and second transistors having a gate, a source and a drain, with the gates of said first and second transistors constituting the first and second input nodes of said first differential amplifier stage, the sources of said first and second transistors being connected in common to the first biasing current source; wherein said second differential amplifier stage comprises third and fourth transistors, each of said third and fourth transistors having a gate, a source and a drain, with the gates of said third and fourth transistors constituting the first and second input nodes of said second differential amplifier stage, the sources of said third and fourth transistors being connected in common to the second biasing current source; and wherein the drains for the first and third transistors are connected in common, and the drains for the second and fourth transistors are connected in common.

14. A preamplifier according to claim 13, wherein said first and second biasing current sources comprise two transistors with the gates thereof connected in common to a bias voltage.

15. A preamplifier according to claim 13, wherein the first differential amplifier stage is connected such that the difference in current at the drains of the first and second transistors which is generated by said first and second transistors is proportional to the difference of the voltage signals applied to the first and second input nodes of said first differential amplifier stage while excluding any common-mode signal present at said first and second input nodes of said first differential amplifier stage.

16. A preamplifier according to claim 15, wherein the second differential amplifier stage is connected such that the difference in current at the drains of the third and fourth transistors which is generated by said third and fourth transistors is proportional to the difference between said reference voltage and a reference signal, said reference signal being proportional to the difference between said final output voltage of the preamplifier and said reference voltage.

17. A preamplifier according to claim 16, wherein said first current mirror comprises fifth and sixth transistors, each of said fifth and sixth transistors having a gate, a source and a drain; the sources of said fifth and sixth transistors being connected to ground, the drain of said fifth transistor being connected to the drain of said third transistor, the drain of said sixth transistor being connected to the drain of said fourth transistor.

18. A preamplifier according to claim 17, wherein said first circuit comprises a seventh transistor, an eighth transistor, a second current mirror, an output transistor, and a fixed current source for said output transistor; wherein the gate of said seventh transistor is connected to the drain of said fifth transistor; wherein the gate of said eighth transistor is connected to the drain of said sixth transistor; wherein said second current mirror is connected so as to be driven by said seventh and eighth transistors; and wherein the gate of said output transistor is connected to the drain of said eighth transistor.

19. A preamplifier according to claim 18, further comprising a first compensation capacitor connected between the gate of said seventh transistor and the output node of said first circuit, and a second compensation capacitor connected between the gate of said output transistor and the output node of said first circuit.

20. A preamplifier according to claim 19, wherein said second circuit comprises a first resistor connected between said output node of said first circuit and said output node of said second circuit, and a second resistor connected between said voltage source and said output node of said second circuit, and wherein the resistance of at least one of said first and second resistors can be varied in order to vary the gain of the preamplifier.

* * * * *